(12) United States Patent
Kuraguchi et al.

(10) Patent No.: US 11,398,473 B2
(45) Date of Patent: Jul. 26, 2022

(54) SEMICONDUCTOR DEVICE

(71) Applicant: KABUSHIKI KAISHA TOSHIBA, Tokyo (JP)

(72) Inventors: Masahiko Kuraguchi, Yokohama (JP); Kentaro Ikeda, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 148 days.

(21) Appl. No.: 17/016,657

(22) Filed: Sep. 10, 2020

(65) Prior Publication Data

US 2021/0217747 A1 Jul. 15, 2021

(30) Foreign Application Priority Data

Jan. 9, 2020 (JP) .............................. JP2020-001895

(51) Int. Cl.
| | | |
|---|---|---|
| *H01L 27/088* | (2006.01) | |
| *H01L 29/20* | (2006.01) | |
| *H01L 29/205* | (2006.01) | |
| *H01L 29/778* | (2006.01) | |

(52) U.S. Cl.
CPC ........ *H01L 27/088* (2013.01); *H01L 29/2003* (2013.01); *H01L 29/205* (2013.01); *H01L 29/7786* (2013.01)

(58) Field of Classification Search
CPC . H01L 27/088; H01L 29/2003; H01L 29/205; H01L 29/7786
USPC ......................................................... 257/401
See application file for complete search history.

(56) References Cited

U.S. PATENT DOCUMENTS

| | | | |
|---|---|---|---|
| 7,202,528 B2 | 4/2007 | Sankin et al. | |
| 8,575,656 B2* | 11/2013 | Yoshioka | ................ H01L 29/78 |
| | | | 257/E27.012 |
| 2012/0228625 A1 | 9/2012 | Ikeda | |
| 2019/0006499 A1 | 1/2019 | Kinoshita et al. | |

FOREIGN PATENT DOCUMENTS

| | | |
|---|---|---|
| JP | 2012-191454 A | 10/2012 |
| JP | 5553997 B2 | 7/2014 |
| JP | 5647191 B2 | 12/2014 |
| JP | 2015-162625 A | 9/2015 |
| JP | WO 2017/159559 A1 | 9/2017 |

* cited by examiner

*Primary Examiner* — Tan N Tran
(74) *Attorney, Agent, or Firm* — Oblon, McClelland, Maier & Neustadt, L.L.P.

(57) ABSTRACT

According to one embodiment, a semiconductor device includes a semiconductor member, a first gate electrode, a second gate electrode, a first control transistor part, a gate interconnect, and a control gate interconnect. The semiconductor member includes first and second semiconductor layers. The semiconductor member includes first and second regions, and a first control region. The first and second gate electrodes extend along a first direction. A direction from the first region toward at least a portion of the first gate electrode is along a second direction crossing the first direction. The first control transistor part includes a first control gate electrode and a first control drain electrode. The first control drain electrode is electrically connected to the first and second gate electrodes. The gate interconnect is electrically connected to the first and second gate electrodes. The control gate interconnect is electrically connected to the first control gate electrode.

19 Claims, 14 Drawing Sheets

SEMICONDUCTOR DEVICE

CROSS-REFERENCE TO RELATED APPLICATIONS

This application is based upon and claims the benefit of priority from Japanese Patent Application No. 2020-001895, filed on Jan. 9, 2020; the entire contents of which are incorporated herein by reference.

FIELD

Embodiments of the invention generally relate to a semiconductor device.

BACKGROUND

For example, it is desirable to improve the characteristics of a semiconductor device such as a transistor or the like.

DETAILED DESCRIPTION

Figure 1:
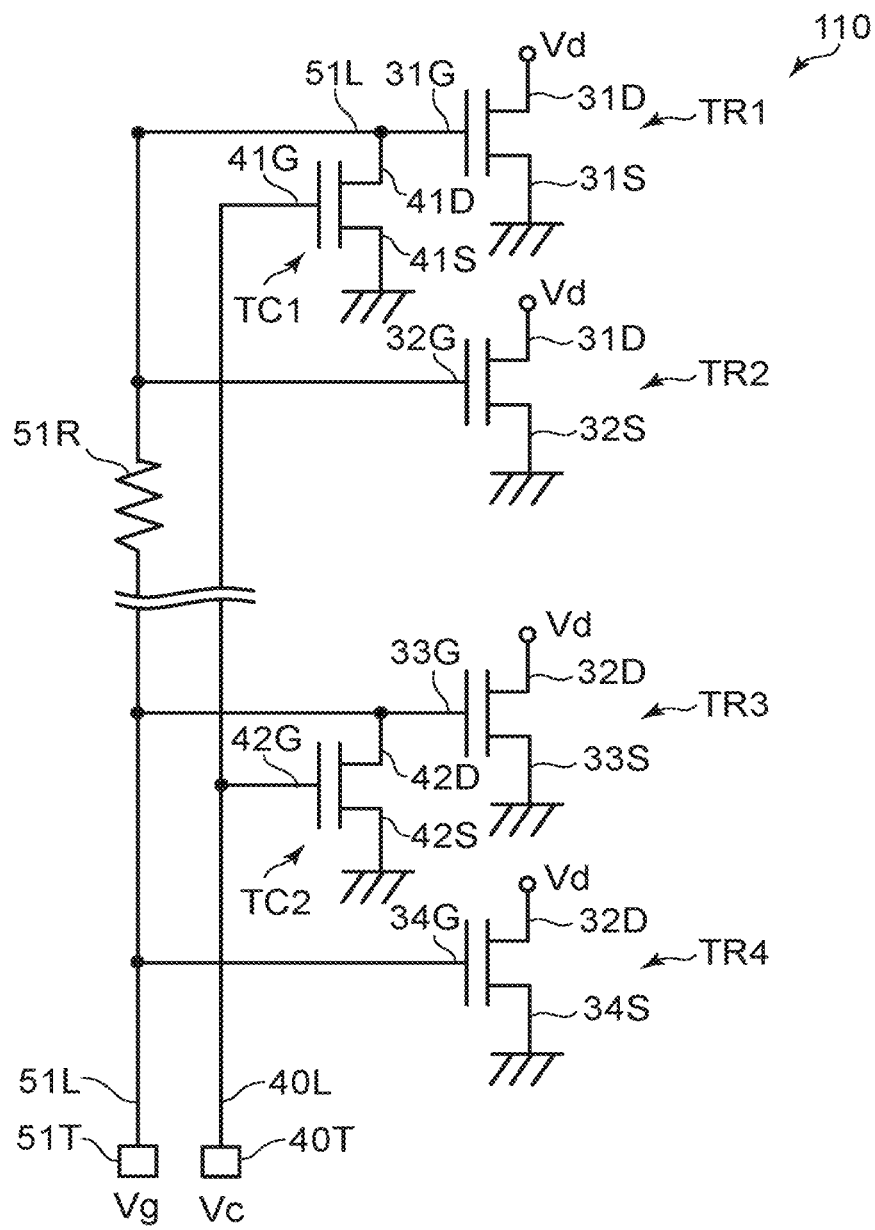
FIG. 1 is a circuit diagram illustrating a semiconductor device according to a first embodiment.

According to one embodiment, a semiconductor device includes a semiconductor member, a first gate electrode, a second gate electrode, a first control transistor part, a gate interconnect, and a control gate interconnect. The semiconductor member includes a first semiconductor layer and a second semiconductor layer. The first semiconductor layer includes $Al_{x1}Ga_{1-x1}N$ (0≤x1<1). The second semiconductor layer includes $Al_{x2}Ga_{1-x2}N$ (0<x2≤1 and x1<x2). The semiconductor member includes a first region, a second region, and a first control region. The first gate electrode extends along a first direction. A direction from the first region toward at least a portion of the first gate electrode is along a second direction crossing the first direction. The second gate electrode extends along the first direction. A direction from the second region toward at least a portion of the second gate electrode is along the second direction. A third direction from the first gate electrode toward the second gate electrode crosses a plane including the first and second directions. The first control transistor part includes a first control gate electrode and a first control drain electrode. A direction from the first control region toward the first control gate electrode is along the second direction. The first control drain electrode is electrically connected to the first and second gate electrodes. The gate interconnect is electrically connected to the first and second gate electrodes. The control gate interconnect is electrically connected to the first control gate electrode.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a circuit diagram illustrating a semiconductor device according to a first embodiment.

Figure 2:
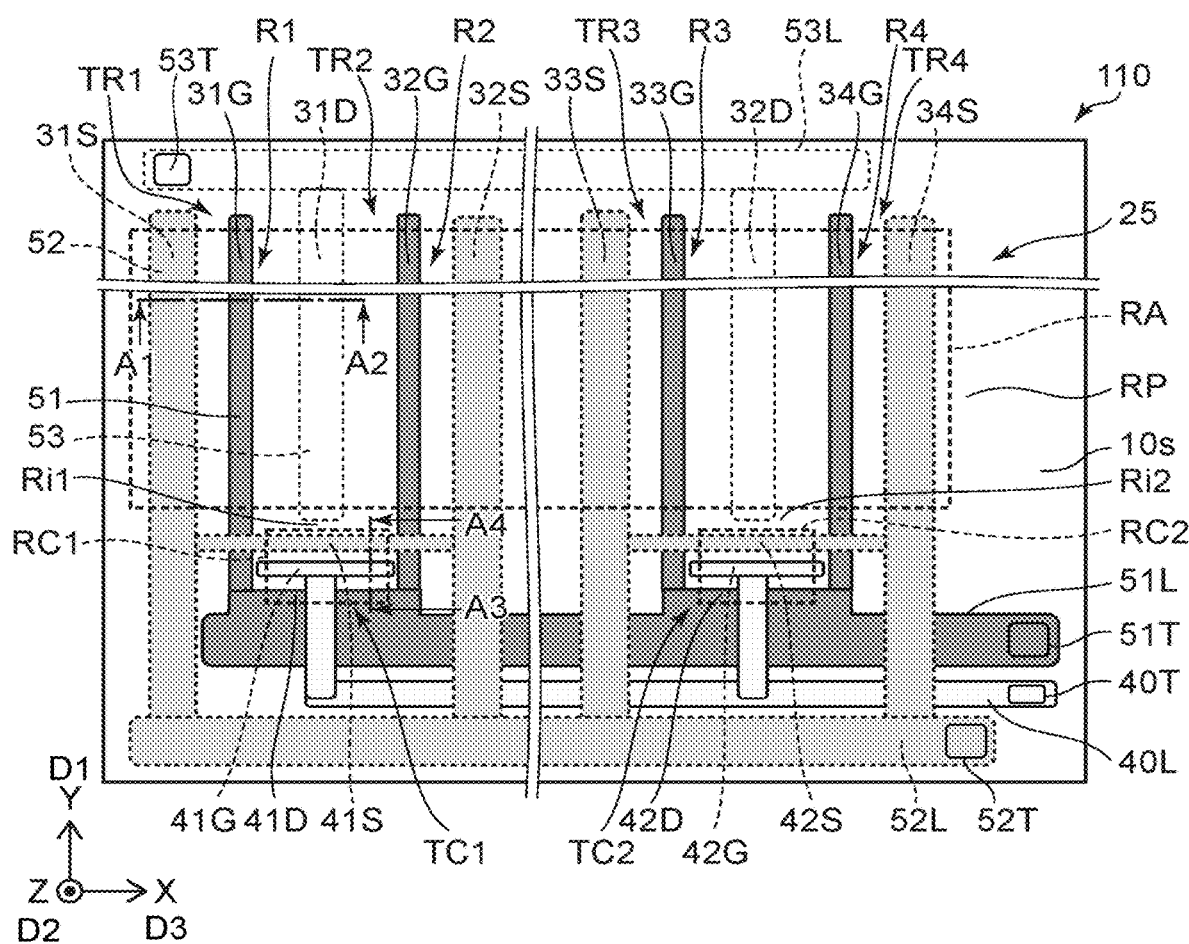
FIG. 2 is a schematic plan view illustrating the semiconductor device according to the first embodiment.

FIG. 2 is a schematic plan view illustrating the semiconductor device according to the first embodiment.

Figure 3:
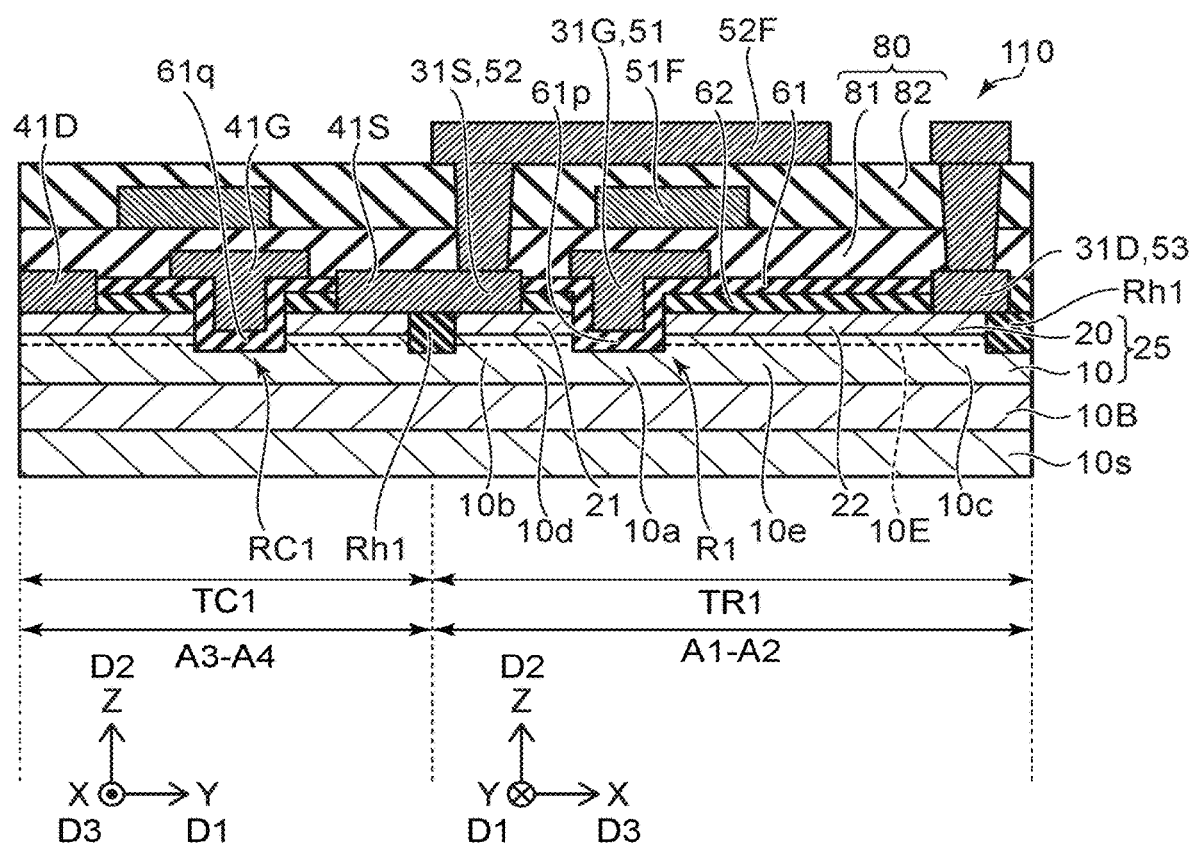
FIG. 3 is a schematic cross-sectional view illustrating the semiconductor device according to the first embodiment.

FIG. 3 is a schematic cross-sectional view illustrating the semiconductor device according to the first embodiment.

An example of a line A1-A2 cross section of FIG. 2 and a line A3-A4 cross section of FIG. 2 are illustrated in FIG. 3. The insulating members and the like are not illustrated in FIG. 2 for easier viewing of the drawing.

As shown in FIGS. 2 and 3, the semiconductor device 110 according to the embodiment includes a semiconductor member 25, a first gate electrode 31G, a second gate electrode 32G, a first control transistor part TC1, a gate interconnect 51L, and a control gate interconnect 40L.

As shown in FIG. 3, the semiconductor member 25 includes a first semiconductor layer 10 and a second semiconductor layer 20. The first semiconductor layer 10 includes $Al_{x1}Ga_{1-x1}N$ (0≤x1<1). The composition ratio of Al in the first semiconductor layer 10 is, for example, 0.1 or less. The first semiconductor layer 10 includes, for example, GaN.

The second semiconductor layer 20 includes $Al_{x2}Ga_{1-x2}N$ (0<x2≤1 and x1<x2). The composition ratio of Al in the second semiconductor layer 20 is, for example, not less than 0.2 and not more than 0.5. The second semiconductor layer 20 includes, for example, AlGaN.

A base body 10s is provided in the example as shown in FIG. 3. The base body 10s is, for example, a silicon substrate. A buffer layer 10B may be provided between the base body 10s and the first semiconductor layer 10. For example, the buffer layer 10B is provided on the base body 10s. The first semiconductor layer 10 is provided on the buffer layer 10B. The second semiconductor layer 20 is provided on the first semiconductor layer 10.

As shown in FIG. 2, for example, the semiconductor member 25 includes an active region RA and a peripheral region RP. The peripheral region RP is provided around the active region RA. The electrical resistance in the peripheral region RP is greater than the electrical resistance in the active region RA.

As shown in FIG. 2, the semiconductor member 25 includes a first region R1, a second region R2, and a first control region RC1. The first region R1 and the second region R2 are, for example, portions of the active region RA. For example, the first control region RC1 is provided in the peripheral region RP. For example, the peripheral region RP is provided around the first control region RC1. For example, the first control region RC1 is surrounded by the peripheral region RP. The first control transistor part TC1 is provided in the first control region RC1.

The active region RA (the first region R1, the second region R2, etc.) and the first control region RC1 are separated from each other. A portion of the peripheral region RP is between the active region RA and the first control region RC1. For example, the semiconductor member 25 includes a first intermediate region Ri1. The first intermediate region Ri1 is provided between the first region R1 and the first control region RC1. The electrical resistance in the first intermediate region Ri1 is greater than the electrical resistance in the first region R1 and greater than the electrical resistance in the first control region RC1.

At least a portion of the first gate electrode 31G and at least a portion of the second gate electrode 32G are provided in the active region RA.

As shown in FIG. 2, the first gate electrode 31G extends along a first direction D1.

The first direction is taken as a Y-axis direction. One direction perpendicular to the Y-axis direction is taken as a Z-axis direction. A direction perpendicular to the Y-axis direction and the Z-axis direction is taken as an X-axis direction.

As shown in FIGS. 2 and 3, the direction from the first region R1 toward at least a portion of the first gate electrode 31G is along a second direction D2. The second direction D2 crosses the first direction D1. The second direction D2 is, for example, the Z-axis direction. The second direction D2 corresponds to the stacking direction of the first and second semiconductor layers 10 and 20.

As shown in FIG. 2, the second gate electrode 32G extends along the first direction D1 (the Y-axis direction). The direction from the second region R2 toward at least a portion of the second gate electrode 32G is along the second direction (e.g., the Z-axis direction). A third direction D3 from the first gate electrode 31G toward the second gate electrode 32G crosses a plane (e.g., the Y-Z plane) including the first direction D1 and the second direction D2. The third direction D3 is, for example, the X-axis direction.

In the example as shown in FIG. 2, the semiconductor device 110 includes a first source electrode 31S, a second source electrode 32S, and a first drain electrode 31D. The first source electrode 31S, the second source electrode 32S, and the first drain electrode 31D extend along the first direction D1. The first drain electrode 31D is between the first source electrode 31S and the second source electrode 32S in the third direction D3 (the X-axis direction). The first gate electrode 31G is between the first source electrode 31S and the first drain electrode 31D in the third direction D3. The second gate electrode 32G is between the first drain electrode 31D and the second source electrode 32S in the third direction D3.

A first transistor TR1 is formed of the first source electrode 31S, the first gate electrode 31G, and the first drain electrode 31D. A second transistor TR2 is formed of the second source electrode 32S, the second gate electrode 32G, and the first drain electrode 31D. The first drain electrode 31D is shared by the first transistor TR1 and the second transistor TR2.

As shown in FIG. 2, a third gate electrode 33G, a fourth gate electrode 34G, a third source electrode 33S, a fourth source electrode 34S, a second drain electrode 32D, etc., also may be provided. As shown in FIG. 2, multiple gate electrodes 51, multiple source electrodes 52, and multiple drain electrodes 53 are provided. The first gate electrode 31G, the second gate electrode 32G, the third gate electrode 33G, and the fourth gate electrode 34G are portions of the multiple gate electrodes 51. The first source electrode 31S, the second source electrode 32S, the third source electrode 33S, and the fourth source electrode 34S are portions of the multiple source electrodes 52. The first drain electrode 31D and the second drain electrode 32D are portions of a portion of the multiple drain electrodes 53.

A third transistor TR3 is formed of the third source electrode 33S, the third gate electrode 33G, and the second drain electrode 32D. A fourth transistor TR4 is formed of the third source electrode 33S, the fourth gate electrode 34G, and the second drain electrode 32D. The second drain electrode 32D is shared by the third transistor TR3 and the fourth transistor TR4. Examples of the third and fourth transistors TR3 and TR4 are described below.

As shown in FIGS. 2 and 3, the first control transistor part TC1 includes a first control gate electrode 41G and a first control drain electrode 41D.

For example, as shown in FIG. 2, the position in the third direction D3 (e.g., the X-axis direction) of the first control gate electrode 41G is between the position in the third direction D3 of the first gate electrode 31G and the position in the third direction D3 of the second gate electrode 32G.

As shown in FIG. 3, the direction from the first control region RC1 toward the first control gate electrode 41G is along the second direction D2 (e.g., the Z-axis direction).

As shown in FIG. 2, the gate interconnect 51L is electrically connected to the multiple gate electrodes 51 (e.g., the first gate electrode 31G, the second gate electrode 32G, etc.). For example, the gate interconnect 51L extends along the third direction D3.

As shown in FIG. 2, the control gate interconnect 40L is electrically connected to the first control gate electrode 41G. For example, the control gate interconnect 40L extends along the third direction D3.

The first control drain electrode 41D is electrically connected to the first and second gate electrodes 31G and 32G. For example, the first control drain electrode 41D is continuous with the gate interconnect 51L. Thereby, the first control drain electrode 41D is electrically connected to the first and second gate electrodes 31G and 32G.

The first control transistor part TC1 includes a first control source electrode 41S. The first control source electrode 41S is electrically connected to the first and second source electrodes 31S and 32S. In the example, the first control source electrode 41S extends in the third direction D3. One end portion of the first control source electrode 41S is connected to the first source electrode 31S. Another end portion of the first control source electrode 41S is connected to the second source electrode 32S.

As shown in FIG. 3, for example, the first semiconductor layer 10 includes a first partial region 10a, a second partial region 10b, a third partial region 10c, a fourth partial region 10d, and a fifth partial region 10e. The direction from the second partial region 10b toward the source electrode 52 (e.g., the first source electrode 31S) is along the second direction D2 (the Z-axis direction). The direction from the third partial region 10c toward the drain electrode 53 (e.g., the first drain electrode 31D) is along the second direction D2.

The first partial region 10a is between the second partial region 10b and the third partial region 10c in the third direction D3 (e.g., the X-axis direction). The fourth partial region 10d is between the second partial region 10b and the first partial region 10a in the third direction D3. The fifth partial region 10e is between the first partial region 10a and the third partial region 10c in the third direction D3.

The second semiconductor layer 20 includes a first semiconductor portion 21 and a second semiconductor portion 22. The direction from the fourth partial region 10d toward the first semiconductor portion 21 is along the second direction D2 (the Z-axis direction). The direction from the fifth partial region 10e toward the second semiconductor portion 22 is along the second direction D2.

In the example, the semiconductor device 110 includes a first insulating film 61. A first insulating portion 61p of the first insulating film 61 is between the first partial region 10a and the gate electrode 51 (e.g., the first gate electrode 31G) in the second direction D2 (the Z-axis direction). For example, at least a portion of the first insulating film 61 is between the first partial region 10a and the gate electrode 51. The first insulating film 61 functions as a gate insulating film. The first insulating film 61 includes, for example, silicon oxide.

For example, a carrier region 10E (referring to FIG. 3) is formed in a portion proximate to the second semiconductor layer 20 of the first semiconductor layer 10. The carrier region 10E is, for example, a two-dimensional electron gas. The semiconductor device 110 is, for example, a HEMT (High Electron Mobility Transistor).

In the example, the direction from at least a portion of the first insulating portion 61p toward the second semiconductor layer 20 is perpendicular to the second direction D2. The first transistor TR1 is, for example, a normally-off transistor.

In the example as shown in FIG. 3, the first insulating film 61 includes a second insulating portion 61q. The second insulating portion 61q is between the first semiconductor layer 10 (the first control region RC1) and the first control gate electrode 41G in the second direction D2.

In the example, the direction from at least a portion of the second insulating portion 61q toward the second semiconductor layer 20 is perpendicular to the second direction D2. The first control transistor part TC1 is, for example, a normally-off transistor.

In the semiconductor device 110, the first control transistor part TC1 is provided for the first transistor TR1 including the first gate electrode 31G and for the second transistor TR2 including the second gate electrode 32G. The first control drain electrode 41D of the first control transistor part TC1 is electrically connected to the first and second gate electrodes 31G and 32G. The potential of the first gate electrode 31G and the potential of the second gate electrode 32G can be controlled to the desired states by the operation of the first control transistor part TC1.

For example, there are cases where the changes of the potential of the first gate electrode 31G and the potential of the second gate electrode 32G are delayed by effects of the resistance of the gate interconnect 51L, etc. Thereby, there are cases where a "self-turn-on" phenomenon or the like occurs. There are cases where the loss is increased thereby.

Even in such a case, the potential of the first gate electrode 31G and the potential of the second gate electrode 32G can be controlled to the desired states by providing the first control transistor part TC1. According to the embodiment, for example, the loss can be suppressed. For example, the power consumption can be reduced. According to the embodiment, a semiconductor device can be provided in which the characteristics can be improved.

For example, a gate terminal 51T is provided as shown in FIGS. 1 and 2. The first gate electrode 31G of the first transistor TR1 and the second gate electrode 32G of the second transistor TR2 are electrically connected to the gate terminal 51T by the gate interconnect 51L.

For example, the first gate electrode 31G is directly connected to the gate terminal 51T via the gate interconnect 51L. For example, a current path that includes the first gate electrode 31G, the gate interconnect 51L, and the gate terminal 51T does not include a transistor. The second gate electrode 32G is directly connected to the gate terminal 51T via the gate interconnect 51L. For example, a current path that includes the second gate electrode 32G, the gate interconnect 51L, and the gate terminal 51T does not include a transistor.

When an element such as a transistor or the like is provided in these current paths, for example, a power supply line for driving the transistor must be provided, and the wiring inside the semiconductor device becomes complex. When an element such as a transistor or the like is provided in these current paths, for example, problems easily occur in that the switching speed must be adjusted using the on-resistance of the transistor, and it is difficult to control the semiconductor device from the outside.

In the embodiment, the first gate electrode 31G and the second gate electrode 32G are connected to the first control drain electrode 41D of the first control transistor part TC1. Because the first gate electrode 31G and the second gate electrode 32G are controlled by the first control transistor part TC1, the first gate electrode 31G and the second gate electrode 32G are controlled to have the same potential as the source electrode 52 without going through the gate interconnect 51L. Thereby, a gate voltage Vg of the transistor (referring to FIG. 1) can be controlled with a low delay, and the self-turn-on can be suppressed.

As shown in FIGS. 1 and 2, for example, the gate interconnect 51L includes a gate resistance 51R. The effects of the gate resistance 51R become large when the first transistor TR1 is distant to the gate terminal 51T. It is favorable for the first control transistor part TC1 to be connected to a gate electrode of a transistor that is distant to the gate terminal 51T. The effects of the gate delay can be suppressed more effectively thereby.

As shown in FIG. 2, the position in the first direction D1 (the Y-axis direction) of the first control gate electrode 41G is between the position in the first direction D1 of the gate interconnect 51L and the position in the first direction D1 of the first drain electrode 31D. For example, the first control gate electrode 41G is provided at the vicinity of the end portion of the multiple gate electrodes 51 at the gate interconnect 51L side. This position is at the supply side of the gate voltage Vg to the multiple gate electrodes 51. By providing the first control gate electrode 41G at such a position, an operation is obtained with a lower delay for the transistors based on the multiple gate electrodes 51.

An example of the voltage of the gate interconnect 51L and the voltage of the control gate interconnect 40L will now be described.

Figure 4A:
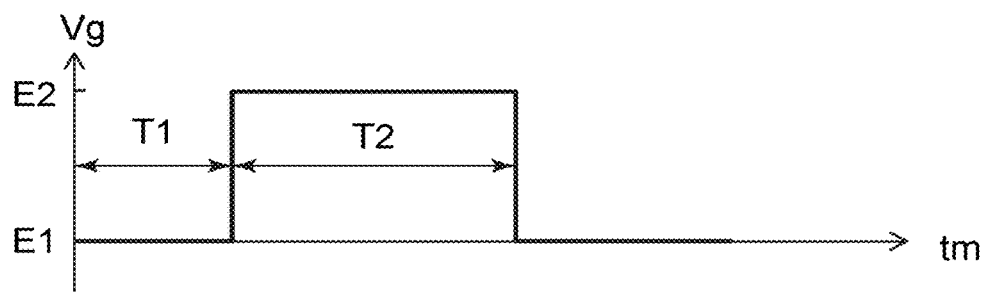
FIGS. 4A and 4B are graphs illustrating the semiconductor device according to the first embodiment.
Figure 4B:
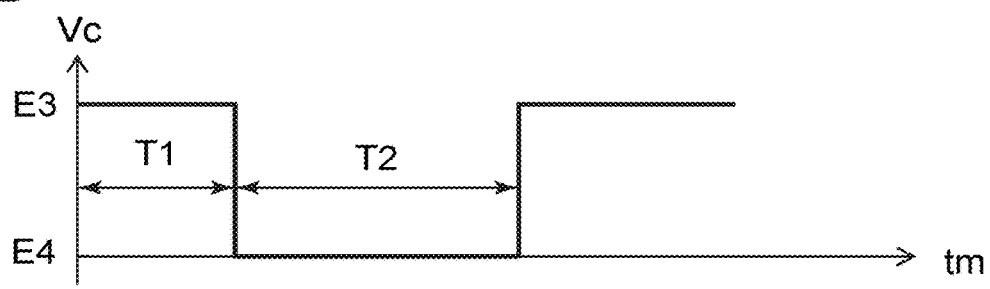

FIGS. 4A and 4B are graphs illustrating the semiconductor device according to the first embodiment.

In these figures, the horizontal axis is a time tm. The vertical axis of FIG. 4A is the gate voltage Vg of the gate interconnect 51L. The vertical axis of FIG. 4B is a control gate voltage Vc of the control gate interconnect 40L.

As shown in FIG. 4A, the gate voltage Vg of the gate interconnect 51L is a first potential E1 in a first period T1. The gate voltage Vg is a second potential E2 in a second period T2. The second potential E2 is greater than the first potential E1. The second period T2 is after the first period T1. The first transistor TR1 and the like are in the off-state in the first period T1. The first transistor TR1 and the like are in the on-state in the second period T2.

As shown in FIG. 4B, the control gate voltage Vc of the control gate interconnect 40L is a third potential E3 in the first period T1. The control gate voltage Vc is a fourth potential E4 in the second period T2. The fourth potential E4 is less than the third potential E3. The first control transistor part TC1 is in the on-state in the first period T1. The first control transistor part TC1 is in the off-state in the second period T2.

For example, a delay of the turn-off of the first transistor TR1 easily occurs due to the gate resistance 51R of the gate interconnect 51L when the first transistor TR1 is distant to the gate terminal 51T. In the embodiment, the delay of the turn-off of the first transistor TR1 can be suppressed because the first control transistor part TC1 is provided at the position of the first transistor TR1.

Thus, for example, the reverse-polarity signal of the gate voltage Vg may be used as the control gate voltage Vc.

As shown in FIG. 1, a control gate terminal 40T may be provided for the control gate interconnect 40L. For example, the control gate voltage Vc may be input to the control gate terminal 40T. The control gate voltage Vc may be generated outside the semiconductor device 110. Or, as described below, the control gate voltage Vc may be generated from the gate voltage Vg input to the gate terminal 51T. Thus, the control gate voltage Vc may be generated inside the semiconductor device 110.

Conductive members 51F and 52F may be provided as shown in FIG. 3. The gate electrode 51 is provided between the semiconductor member 25 and the conductive member 52F. The conductive member 51F is provided between the gate electrode 51 and the conductive member 52F. For example, the conductive members 51F and 52F function as field plates. Electric field concentration is suppressed; for example, a high breakdown voltage is obtained.

An insulating member 80 may be provided. In the example, the insulating member 80 includes a first insulating region 81 and a second insulating region 82. At least a portion of the first insulating region 81 is between the gate electrode 51 and the conductive member 51F. At least a portion of the second insulating region 82 is between the conductive member 51F and the conductive member 52F.

A second insulating film 62 may be provided as shown in FIG. 3. The second insulating film 62 is between the second semiconductor layer 20 and a portion of the first insulating film 61. The second insulating film 62 functions as a protective film of the semiconductor member 25. The second insulating film 62 includes, for example, silicon nitride, etc. The first insulating film 61 includes, for example, silicon oxide, silicon oxynitride, aluminum oxide, hafnium oxide, aluminum nitride, etc.

As shown in FIG. 3, a high resistance region Rh1 may be provided in the semiconductor member 25. The high resistance region Rh1 is, for example, an element separation region. The electrical resistance in the high resistance region Rh1 is greater than the electrical resistance in the active region (e.g., the first region R1, the second region R2, etc.). A portion of the high resistance region Rh1 corresponds to the peripheral region RP. A portion of the high resistance region Rh1 corresponds to the first intermediate region Ri1, etc.

As shown in FIGS. 1 and 2, the semiconductor device 110 may include the third gate electrode 33G, the fourth gate electrode 34G, and a second control transistor part TC2. The third gate electrode 33G and the fourth gate electrode 34G extend along the first direction D1 (the Y-axis direction).

As shown in FIG. 2, the second gate electrode 32G is between the first gate electrode 31G and the fourth gate electrode 34G in the third direction D3 (e.g., the X-axis direction). The third gate electrode 33G is between the second gate electrode 32G and the fourth gate electrode 34G in the third direction D3.

As shown in FIG. 2, the semiconductor member 25 includes a third region R3, a fourth region R4, and a second control region RC2. The direction from the third region R3 toward at least a portion of the third gate electrode 33G is along the second direction D2 (e.g., the Z-axis direction). The direction from the fourth region R4 toward at least a portion of the fourth gate electrode 34G is along the second direction D2.

The second control transistor part TC2 includes a second control gate electrode 42G and a second control drain electrode 42D. For example, the position in the third direction D3 (the X-axis direction) of the second control gate electrode 42G is between the position in the third direction D3 of the third gate electrode 33G and the position in the third direction D3 of the fourth gate electrode 34G.

The direction from the second control region RC2 toward the second control gate electrode 42G is along the second direction D2 (e.g., the Z-axis direction). The second control drain electrode 42D is electrically connected to the third and fourth gate electrodes 33G and 34G. For example, as shown in FIG. 2, the second control drain electrode 42D is continuous with the gate interconnect 51L. Thereby, the second control drain electrode 42D is electrically connected to the third and fourth gate electrodes 33G and 34G. A second intermediate region Ri2 may be provided between the second control region RC2 and the active region RA. The electrical resistance in the second intermediate region Ri2 is greater than the electrical resistance in the third region R3 and greater than the electrical resistance in the second control region RC2.

As shown in FIGS. 1 and 2, the third gate electrode 33G and the fourth gate electrode 34G are electrically connected to the gate interconnect 51L. The second control gate electrode 42G is electrically connected to the control gate interconnect 40L.

The third source electrode 33S, the fourth source electrode 34S, and the second drain electrode 32D are provided as shown in FIG. 2. The third source electrode 33S, the fourth source electrode 34S, and the second drain electrode 32D extend along the first direction D1.

The second drain electrode 32D is between the third source electrode 33S and the fourth source electrode 34S in the third direction D3 (the X-axis direction). The third gate electrode 33G is between the third source electrode 33S and the second drain electrode 32D in the third direction D3. The fourth gate electrode 34G is between the second drain electrode 32D and the fourth source electrode 34S in the third direction D3.

As shown in FIG. 2, for example, the position in the first direction D1 (the Y-axis direction) of the second control gate electrode 42G is between the position in the first direction D1 of the gate interconnect 51L and the position in the first direction D1 of the second drain electrode 32D.

The potential of the third gate electrode 33G and the potential of the fourth gate electrode 34G can be controlled to the desired states by providing the second control transistor part TC2. The delay of the potential of the third gate electrode 33G and the potential of the fourth gate electrode 34G can be suppressed. For example, the loss can be suppressed. For example, the power consumption can be reduced. The characteristics can be improved further.

The second control transistor part TC2 includes a second control source electrode 42S. The second control source electrode 42S is electrically connected to the third and fourth source electrodes 33S and 34S. In the example, the second control source electrode 42S extends in the third direction D3. One end portion of the second control source electrode 42S is connected to the third source electrode 33S. Another end portion of the second control source electrode 42S is connected to the fourth source electrode 34S.

A source interconnect 52L and a source terminal 52T may be provided as shown in FIG. 2. The source interconnect 52L is electrically connected to the multiple source electrodes 52 (e.g., the first to fourth source electrodes 31S to 34S, etc.). The source terminal 52T is electrically connected to the source interconnect 52L. For example, the potential of the source terminal 52T is fixed. For example, the source terminal 52T is set to a ground potential.

A drain interconnect 53L and a drain terminal 53T may be provided as shown in FIG. 2. The drain interconnect 53L is electrically connected to the multiple drain electrodes 53 (e.g., the first drain electrode 31D, the second drain electrode 32D, etc.). The drain terminal 53T is electrically connected to the drain interconnect 53L.

As shown in FIG. 1, for example, a drain voltage Vd is applied to the drain electrodes (the first drain electrode 31D and the second drain electrode 32D) of the first to fourth transistors TR1 to TR4. For example, the drain voltage Vd is supplied from the drain terminal 53T.

Figure 5:
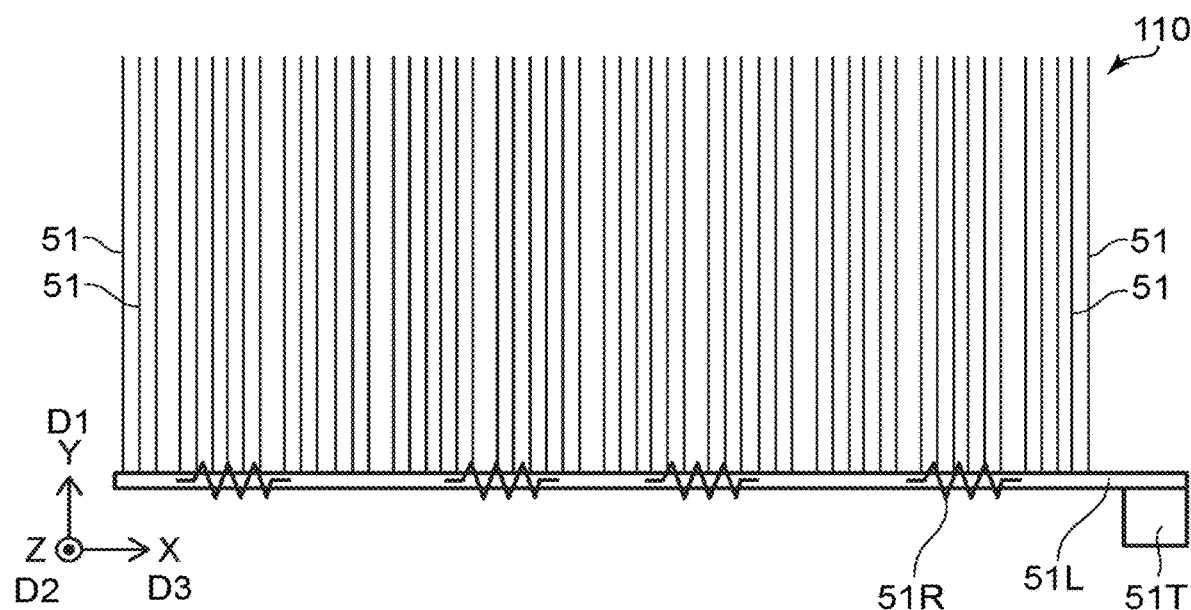
FIG. 5 is a schematic plan view illustrating the semiconductor device.

FIG. 5 is a schematic plan view illustrating the semiconductor device.

In FIG. 5, the multiple gate electrodes 51 and the gate interconnect 51L of the semiconductor device 110 are schematically shown in isolation. As shown in FIG. 5, the multiple gate electrodes 51 are provided in the semiconductor device 110. The number of the multiple gate electrodes 51 is, for example, 50 or more. The number may be 100 or more. The multiple gate electrodes 51 are electrically connected to the gate interconnect 51L. The gate terminal 51T is provided at the end of the gate interconnect 51L. The gate interconnect 51L includes the gate resistance 51R. One of the multiple gate electrodes 51 is most distant to the gate terminal 51T. The effects of the gate resistance 51R are large at this position. An example of the change of the gate voltage Vg at this position will now be described.

Figure 6:
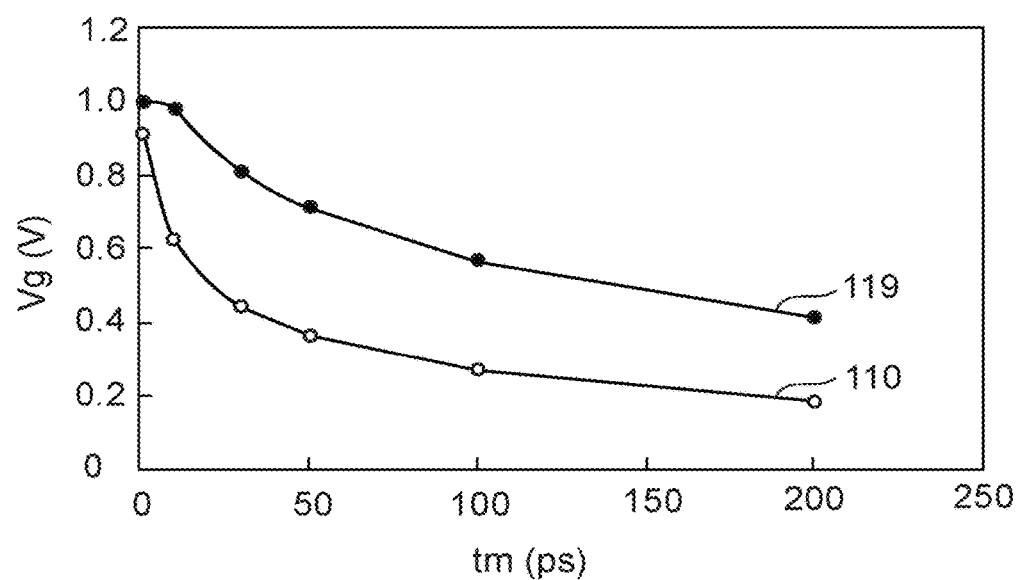
FIG. 6 is a graph illustrating characteristics of semiconductor devices.

FIG. 6 is a graph illustrating characteristics of semiconductor devices.

The horizontal axis of FIG. 6 is the time tm. The vertical axis of FIG. 6 is the gate voltage Vg. FIG. 6 illustrates a characteristic of the semiconductor device 110 and a characteristic of a semiconductor device 119 of a reference example. As described above, the first control transistor part TC1 is provided in the semiconductor device 110. The first control transistor part TC1 is not provided in the semiconductor device 119. FIG. 6 illustrates a transient phenomenon of the gate voltage Vg when the gate voltage Vg transitions to the off-state of 0 V from the state in which the gate voltage Vg generated by the self-turn-on has become 1 V (volts).

As shown in FIG. 6, the decrease of the gate voltage Vg is delayed in the semiconductor device 119. This is due to the effects of the gate resistance 51R. As shown in FIG. 6, compared to the semiconductor device 119, the gate voltage Vg decreases in a short period of time in the semiconductor device 110. In the semiconductor device 110, the first transistor TR1 and the second transistor TR2 are set to the off-state in a short period of time. For example, the power consumption can be suppressed.

It is favorable for the first control transistor part TC1 to be provided for the gate electrode 51 distant to the gate terminal 51T. The delay due to the effects of the gate resistance 51R can be effectively suppressed thereby.

Figure 7:
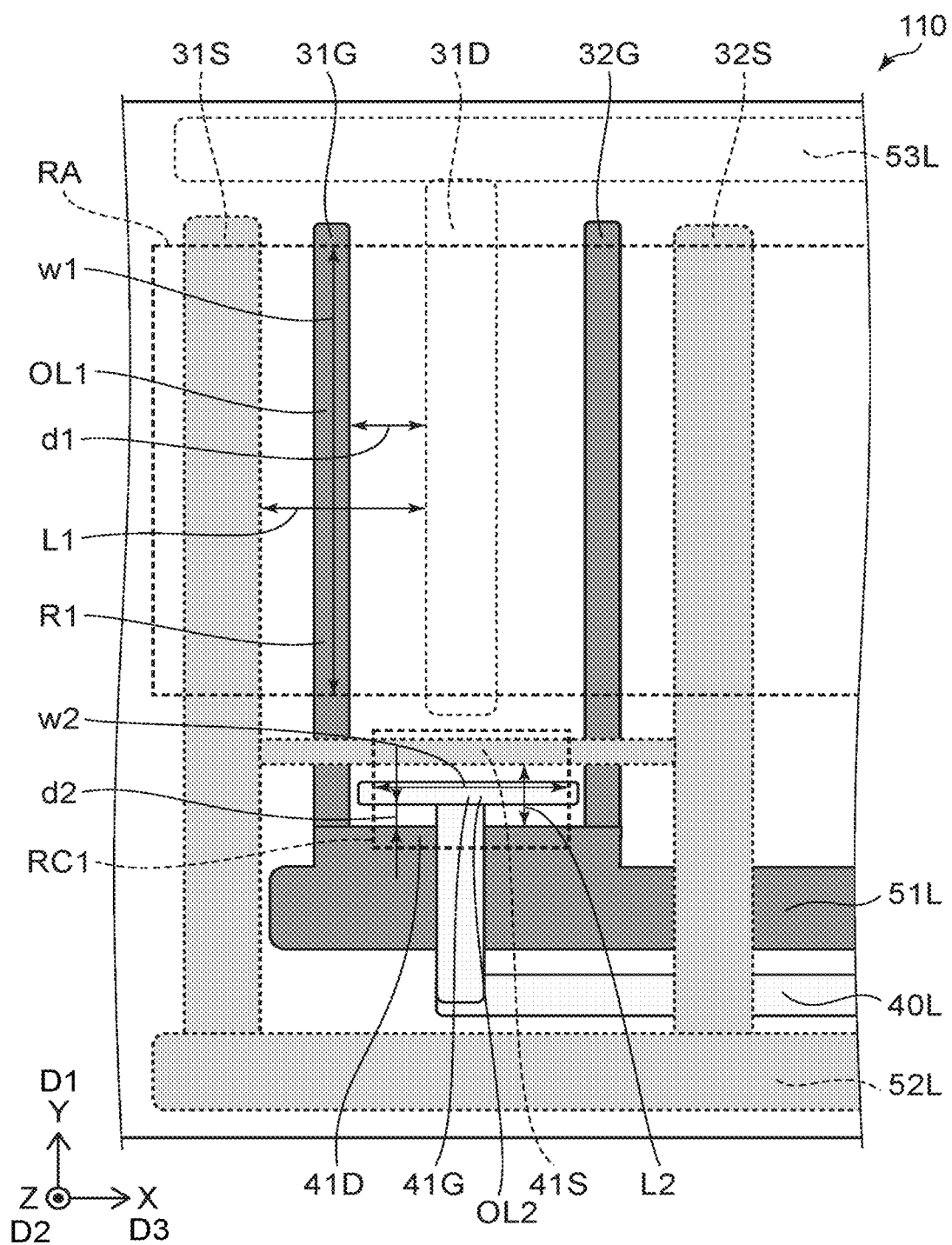
FIG. 7 is a schematic plan view illustrating the semiconductor device according to the first embodiment.

FIG. 7 is a schematic plan view illustrating the semiconductor device according to the first embodiment.

FIG. 7 is an enlarged illustration of a portion of FIG. 2.

As shown in FIG. 7, the distance along the first direction D1 between the first control gate electrode 41G and the gate interconnect 51L is taken as a distance d2. The distance d2 corresponds to the gate-drain distance of the first control transistor part TC1. On the other hand, the distance along the third direction D3 between the first gate electrode 31G and the first drain electrode 31D is taken as a distance d1. The distance d1 corresponds to the gate-drain distance of the first transistor TR1. In the embodiment, it is favorable for the distance d2 to be less than the distance d1. Thereby, for example, high-speed switching of the first control transistor part TC1 is obtained.

Thus, it is favorable for the gate-drain distance (the distance d2) of the first control transistor part TC1 to be less than the distance d1.

As shown in FIG. 7, the first gate electrode 31G includes a first overlap region OL1. The first overlap region OL1 overlaps the first region R1 in the second direction D2 (the Z-axis direction). As described above, the first region R1 is a portion of the active region RA.

The first control gate electrode 41G includes a second overlap region OL2. The second overlap region OL2 overlaps the first control region RC1 in the second direction D2. As described above, the first control transistor part TC1 includes the first control source electrode 41S. The first control source electrode 41S is electrically connected to the first and second source electrodes 31S and 32S.

The length along the first direction D1 of the first overlap region OL1 is taken as a width w1. The distance along the third direction D3 between the first source electrode 31S and the first drain electrode 31D is taken as a distance L1. The ratio (w1/L1) of the width w1 to the distance L1 is taken as a first ratio. For example, it is favorable for the first ratio to be not less than 10 and not more than 300. Thereby, for example, the delay of the gate voltage Vg in the gate-finger direction can be reduced.

The length along the third direction D3 of the second overlap region OL2 is taken as a width w2. The distance along the first direction D1 between the first control source electrode 41S and the first gate interconnect 51L is taken as a distance L2. The ratio (w2/L2) of the width w2 to the distance L2 is taken as a second ratio. It is favorable for the second ratio to be 2 or more. Thereby, it is easier to set the on-resistance of the first control transistor part TC1 to be less than the resistance of the gate interconnect 51L. It is more favorable for the second ratio to be 10 or more. Thereby, it is even easier to set the on-resistance of the first control transistor part TC1 to be less than the resistance of the gate interconnect 51L.

Figure 8:
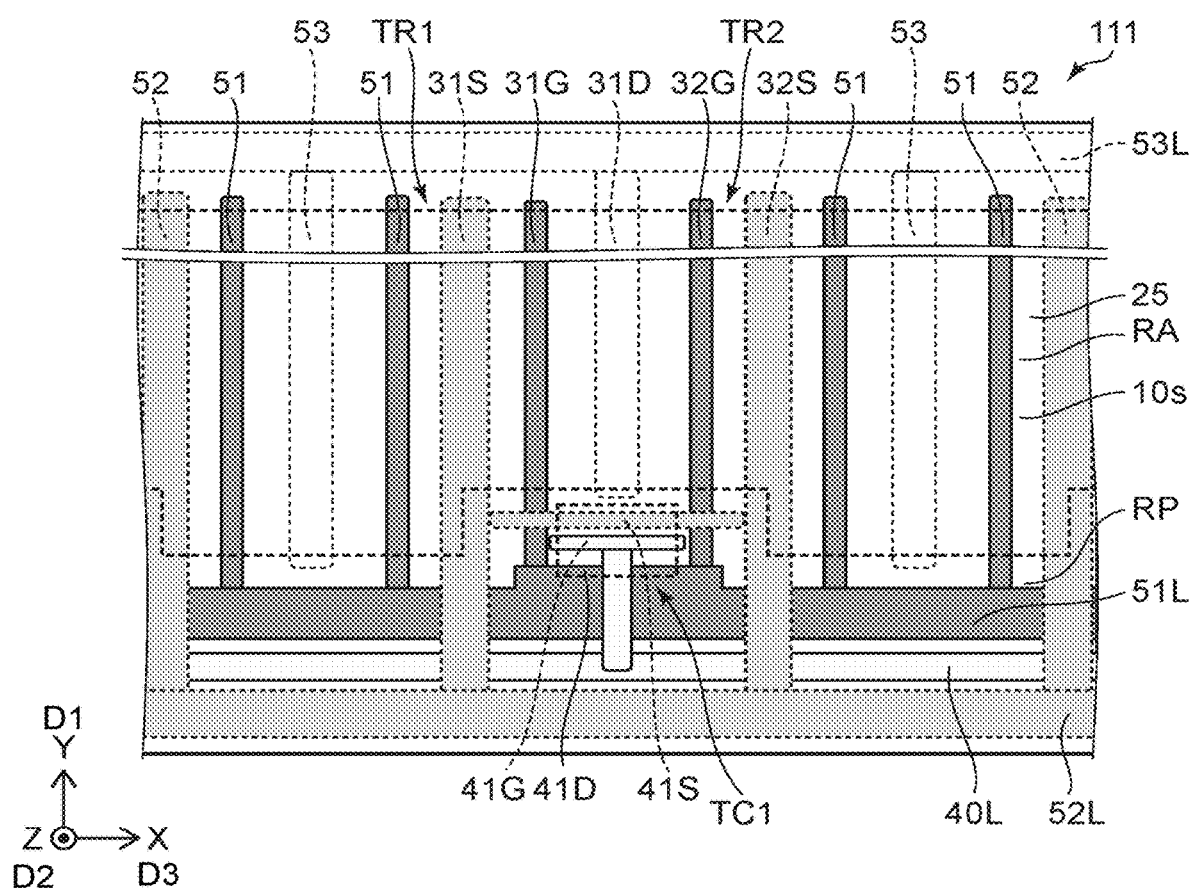
FIG. 8 is a schematic plan view illustrating a semiconductor device according to the first embodiment.

FIG. 8 is a schematic plan view illustrating a semiconductor device according to the first embodiment.

As in the semiconductor device 111 shown in FIG. 8, for example, one first control transistor part TC1 may be provided for two of four gate electrodes 51. In the embodiment, one first control transistor part TC1 may be provided for the multiple gate electrodes 51 (e.g., the first gate electrode 31G and the second gate electrode 32G). For example, by providing one first control transistor part TC1 for the multiple gate electrodes 51, the surface area of the transistors formed of multiple gate electrodes 51 can be enlarged. For example, a low on-resistance is obtained.

Figure 9:
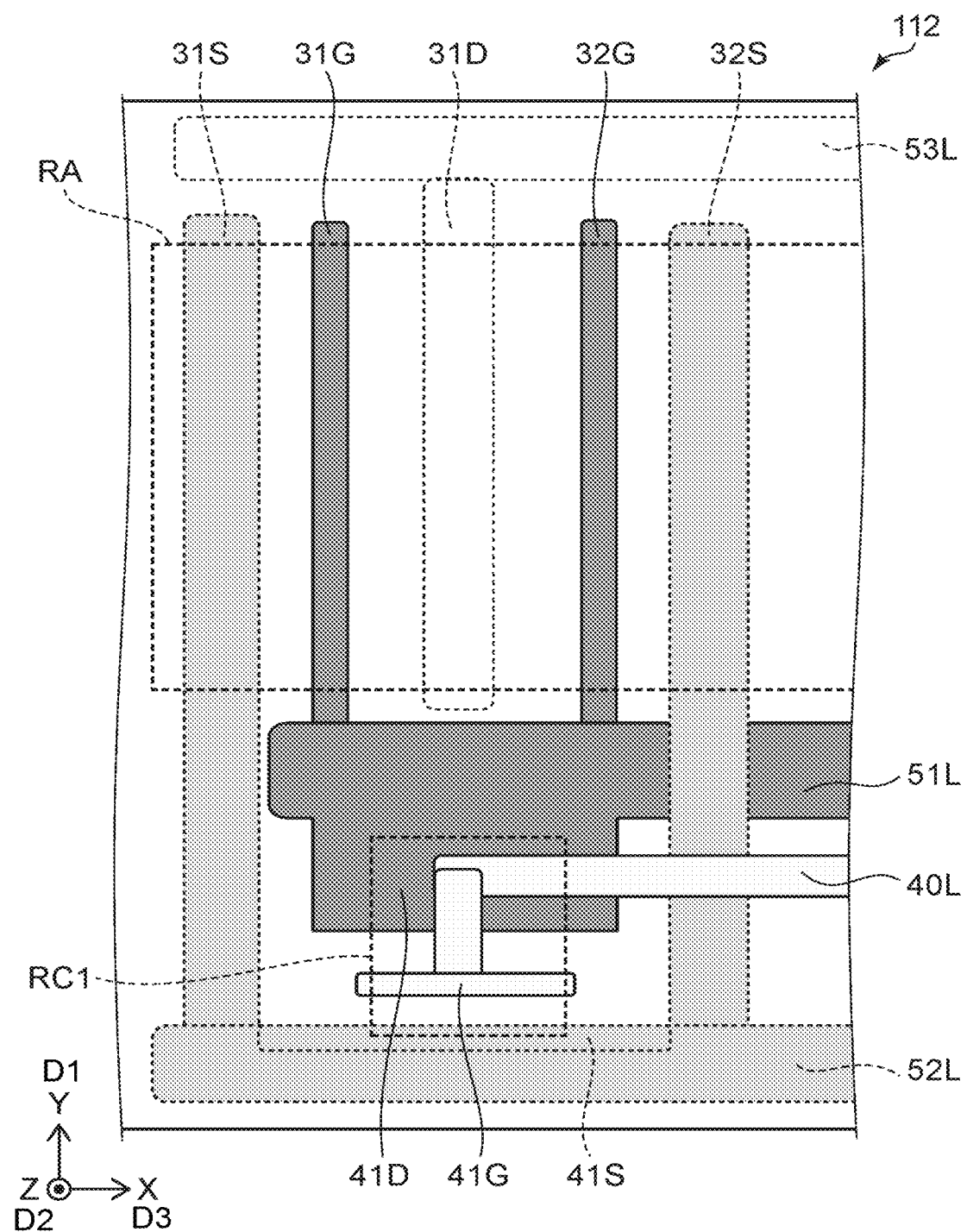
FIG. 9 is a schematic plan view illustrating a semiconductor device according to the first embodiment.

FIG. 9 is a schematic plan view illustrating a semiconductor device according to the first embodiment.

FIG. 9 is an enlarged illustration corresponding to a portion of FIG. 2. In the semiconductor device 112 according to the embodiment as shown in FIG. 9, the position in the first direction D1 (the Y-axis direction) of the first control gate electrode 41G is between the position in the first direction D1 of the source interconnect 52L and the position in the first direction D1 of the gate interconnect 51L. The position in the first direction D1 of the control gate interconnect 40L is between the position in the first direction D1 of the source interconnect 52L and the position in the first direction D1 of the gate interconnect 51L.

Figure 10:
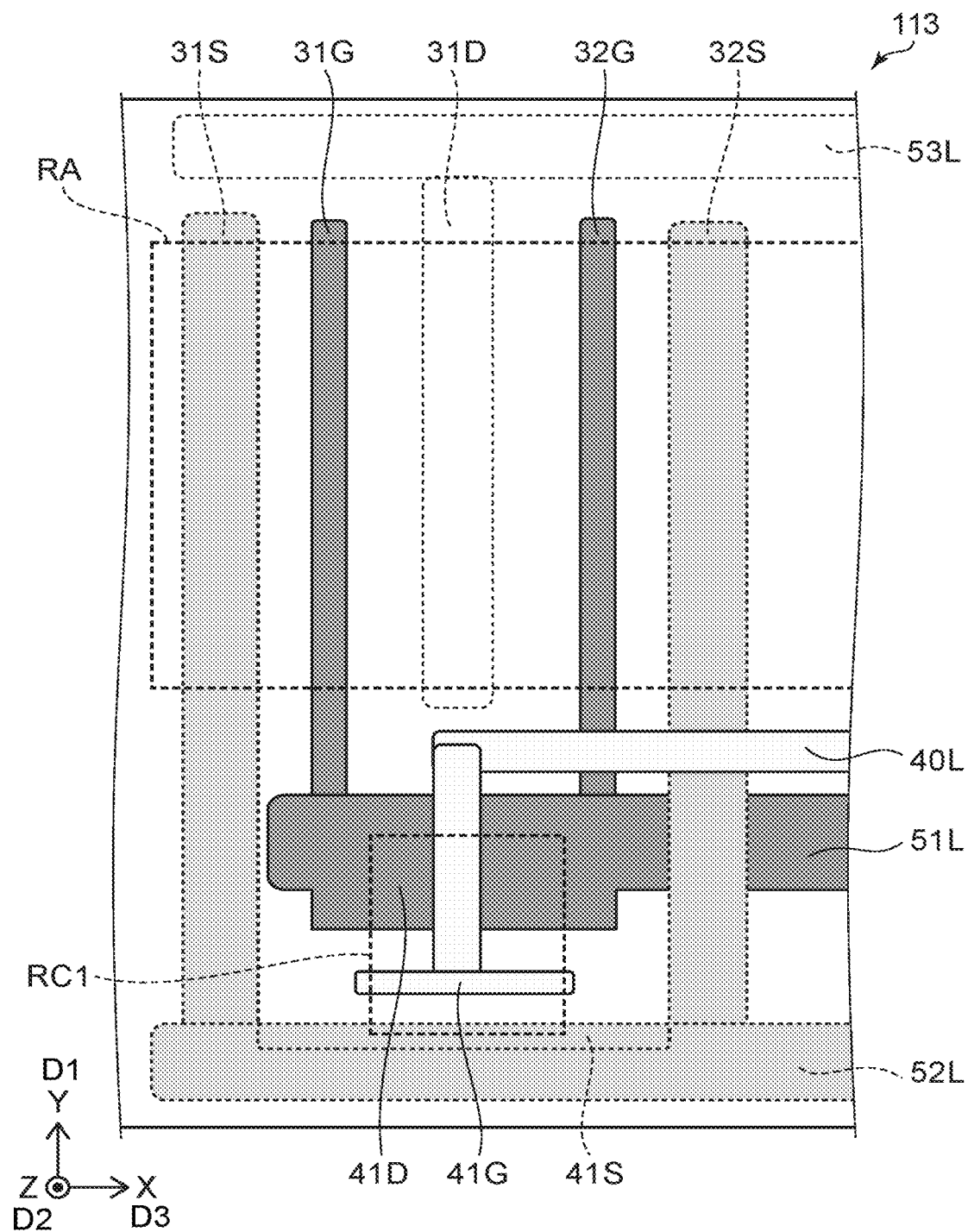
FIG. 10 is a schematic plan view illustrating a semiconductor device according to the first embodiment.

FIG. 10 is a schematic plan view illustrating a semiconductor device according to the first embodiment.

FIG. 10 is an enlarged illustration corresponding to a portion of FIG. 2. In the semiconductor device 113 according to the embodiment as shown in FIG. 10, the position in the first direction D1 (the Y-axis direction) of the first control gate electrode 41G is between the position in the first direction D1 of the source interconnect 52L and the position in the first direction D1 of the gate interconnect 51L. The position in the first direction D1 of the gate interconnect 51L is between the position in the first direction D1 of the source interconnect 52L and the position in the first direction D1 of the control gate interconnect 40L.

In the embodiment, various modifications of the order of the gate interconnect 51L, the control gate interconnect 40L, and the first control source electrode 41S are possible. In the first control transistor part TC1, the orientation from the first control source electrode 41S toward the first control drain electrode 41D may be the reverse of the orientations of the examples described above.

Second Embodiment

Figure 11:
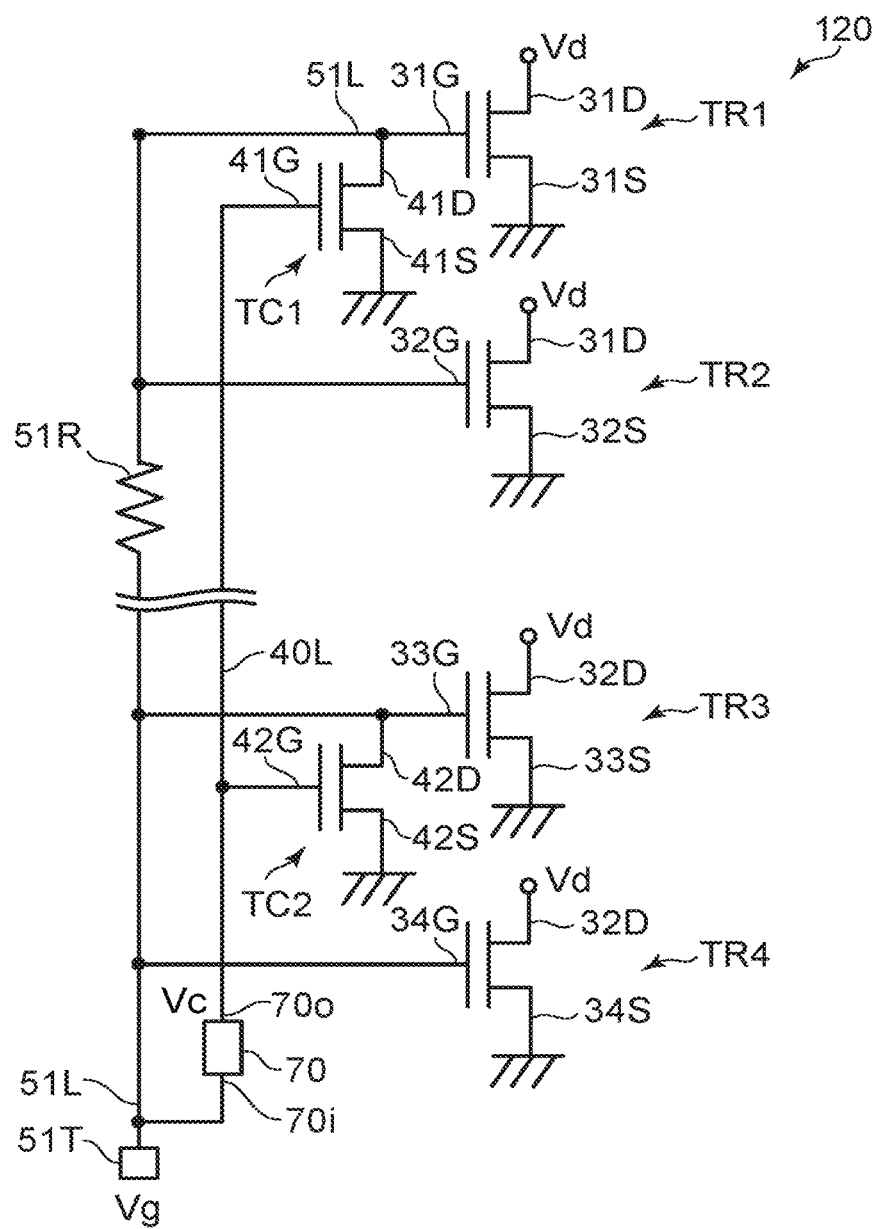
FIG. 11 is a circuit diagram illustrating a semiconductor device according to a second embodiment.

FIG. 11 is a circuit diagram illustrating a semiconductor device according to a second embodiment.

As shown in FIG. 11, the semiconductor device 120 according to the second embodiment includes a control circuit 70 in addition to the first gate electrode 31G, the second gate electrode 32G, the first control transistor part TC1, the gate interconnect 51L, and the control gate interconnect 40L. The first gate electrode 31G is included in the first transistor TR1. The second gate electrode 32G is included in the second transistor TR2. The configurations of the first gate electrode 31G, the second gate electrode 32G, the first control transistor part TC1, the gate interconnect 51L, and the control gate interconnect 40L of the semiconductor device 110 are applicable to the configurations of the first gate electrode 31G, the second gate electrode 32G, the first control transistor part TC1, the gate interconnect 51L, and the control gate interconnect 40L of the semiconductor device 120. An example of the control circuit 70 will now be described.

As shown in FIG. 11, the control circuit 70 includes an input part 70i and an output part 70o. The input part 70i is electrically connected to the gate interconnect 51L. The output part 70o is electrically connected to the control gate interconnect 40L.

The control circuit 70 supplies, to the control gate interconnect 40L, the control gate voltage Vc corresponding to the gate voltage Vg of the gate interconnect 51L. The control gate voltage Vc is, for example, the voltage described in reference to FIGS. 4A and 4B.

As shown in FIG. 4A, the gate voltage Vg is the first potential E1 in the first period T1. The gate voltage Vg is the second potential E2 in the second period T2. The second potential E2 is greater than the first potential E1. The control gate voltage Vc is the third potential E3 in the first period T1. The control gate voltage Vc is the fourth potential E4 in the second period T2. The fourth potential E4 is less than the third potential E3.

By providing the control circuit 70, the desired control gate voltage Vc is obtained from the gate voltage Vg that is input.

In the embodiment, the control circuit 70 may be provided separately from the semiconductor device (e.g., the semiconductor device 110, etc.) according to the embodiment.

Figure 12:
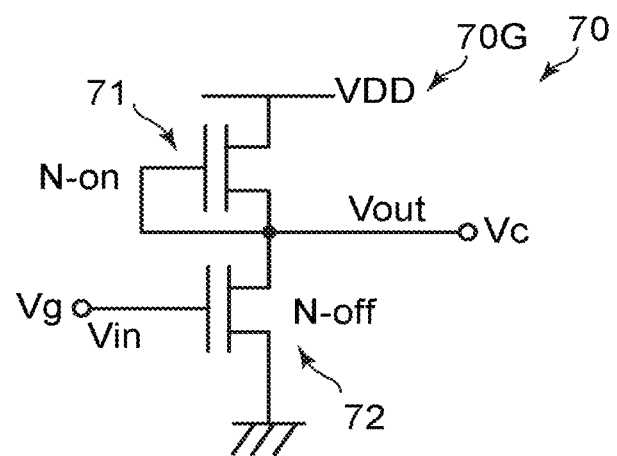
FIG. 12 is a circuit diagram illustrating a portion of the semiconductor device according to the second embodiment.

FIG. 12 is a circuit diagram illustrating a portion of the semiconductor device according to the second embodiment.

FIG. 12 shows an example of the control circuit 70. The control circuit 70 includes a normally-on transistor 71 and a normally-off transistor 72. A power supply voltage VDD is applied to the drain of the transistor 71. The source of the transistor 71 is electrically connected to the gate of the transistor 71 and the drain of the transistor 72. An input signal Vin (the gate voltage Vg) is input to the gate of the transistor 72. The source of the transistor 72 is set to the ground potential. An output signal Vout is output from a connection point between the source of the transistor 71, the gate of the transistor 71, and the drain of the transistor 72. The output signal Vout corresponds to the control gate voltage Vc.

A NOT gate 70G is formed of the transistor 71 and the transistor 72. Thus, the control circuit 70 may include the NOT gate 70G.

Third Embodiment

Figure 13:
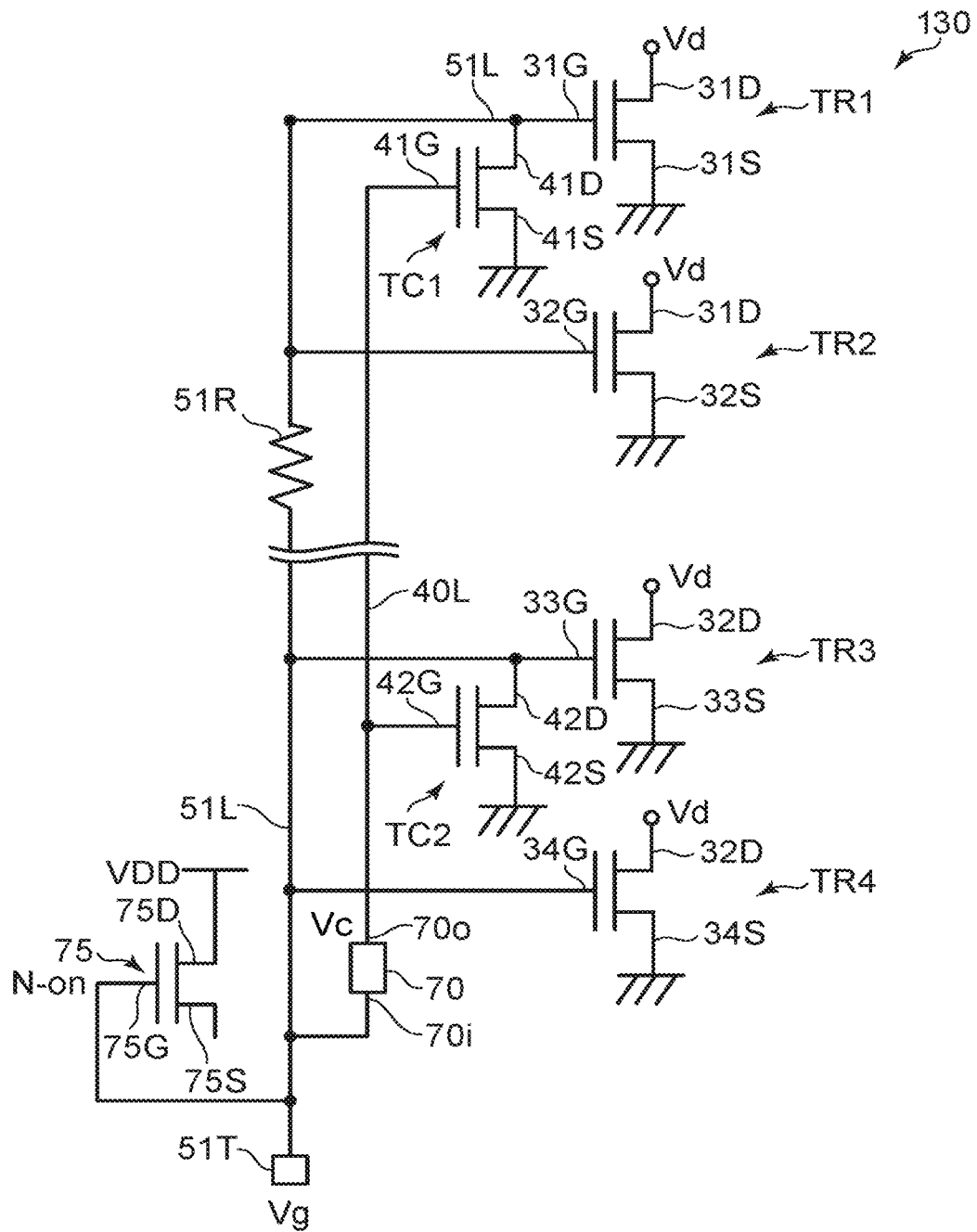
FIG. 13 is a circuit diagram illustrating a semiconductor device according to a third embodiment.

FIG. 13 is a circuit diagram illustrating a semiconductor device according to a third embodiment.

As shown in FIG. 13, the semiconductor device 130 according to the third embodiment includes the control circuit 70 and a first control circuit transistor 75 in addition to the first gate electrode 31G, the second gate electrode 32G, the first control transistor part TC1, the gate interconnect 51L, and the control gate interconnect 40L. The configurations of the first gate electrode 31G, the second gate electrode 32G, the first control transistor part TC1, the gate interconnect 51L, and the control gate interconnect 40L of the semiconductor device 110 are applicable to the first gate electrode 31G, the second gate electrode 32G, the first control transistor part TC1, the gate interconnect 51L, and the control gate interconnect 40L of the semiconductor device 130. An example of the control circuit 70 and the first control circuit transistor 75 of the semiconductor device 130 will now be described.

The first control circuit transistor 75 is a normally-on transistor.

The control circuit 70 includes the input part 70i and the output part 70o. The input part 70i is electrically connected to the gate interconnect 51L. The output part 70o is electrically connected to the control gate interconnect 40L. The first control circuit transistor 75 includes a first control circuit gate 75G and a first control circuit source 75S. The first control circuit gate 75G and the first control circuit source 75S are electrically connected to the gate interconnect 51L. The power supply voltage VDD is applied to a first control circuit drain 75D of the first control circuit transistor 75.

For example, the control circuit 70 may have the configuration illustrated in FIG. 12.

In the semiconductor device 130, a buffer amplifier is formed of the first control circuit transistor 75 that is provided externally, and the first control transistor part TC1 that is provided for the finger portions.

Fourth Embodiment

Figure 14:
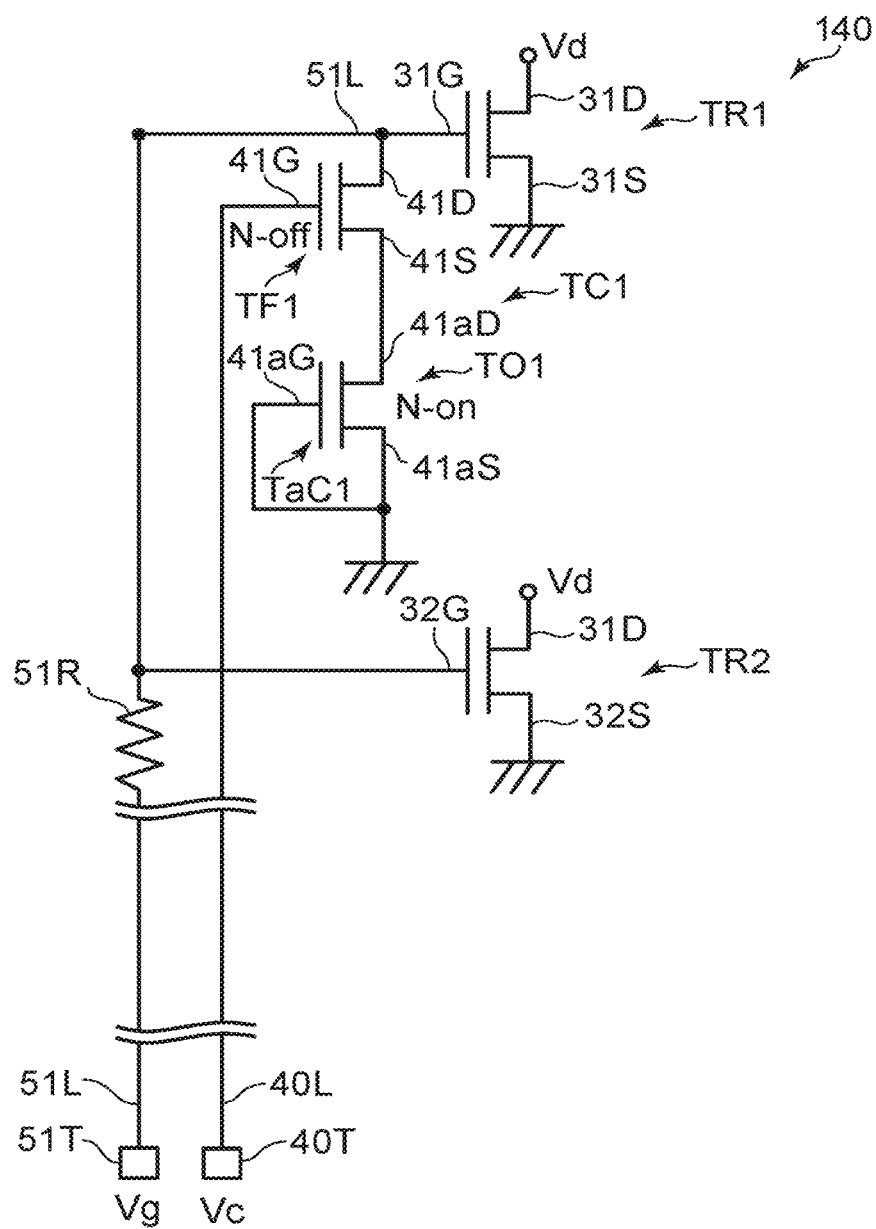
FIG. 14 is a circuit diagram illustrating a semiconductor device according to a fourth embodiment.

FIG. 14 is a circuit diagram illustrating a semiconductor device according to a fourth embodiment.

As shown in FIG. 14, the semiconductor device 140 according to the fourth embodiment includes the first gate electrode 31G, the second gate electrode 32G, the first control transistor part TC1, and the gate interconnect 51L. The configurations of the first gate electrode 31G, the second gate electrode 32G, the gate interconnect 51L, and the control gate interconnect 40L of the semiconductor device 110 are applicable to the first gate electrode 31G, the second gate electrode 32G, the gate interconnect 51L, and the control gate interconnect 40L of the semiconductor device 140. An example of the first control transistor part TC1 of the semiconductor device 140 will now be described.

As shown in FIG. 14, the first control transistor part TC1 includes a normally-off transistor TF1 and a normally-on transistor TO1. The normally-off transistor TF1 includes the first control gate electrode 41G and the first control drain electrode 41D described above. As described above, the first control gate electrode 41G is electrically connected to the control gate interconnect 40L. The first control drain electrode 41D is electrically connected to the first and second gate electrodes 31G and 32G.

The source of the normally-off transistor TF1 corresponds to the first control source electrode 41S. The source of the normally-off transistor TF1 is electrically connected to a drain 41aD of the normally-on transistor TO1. A gate 41aG of the normally-on transistor TO1 is electrically connected to a source 41aS of the normally-on transistor TO1. For example, the source 41aS is electrically connected to the first and second source electrodes 31S and 32S.

Thus, the first control transistor part TC1 may have a double-gate structure. For example, a high on/off ratio is obtained thereby. By using the double-gate structure, for example, the current that passes through the first control transistor part TC1 from these gate electrodes to the source electrode 52 can be controlled to control the potentials of the first and second gate electrodes 31G and 32G. For example, the switching speed can be controlled by the double-gate structure. The noise can be reduced by the double-gate structure.

Figure 15:
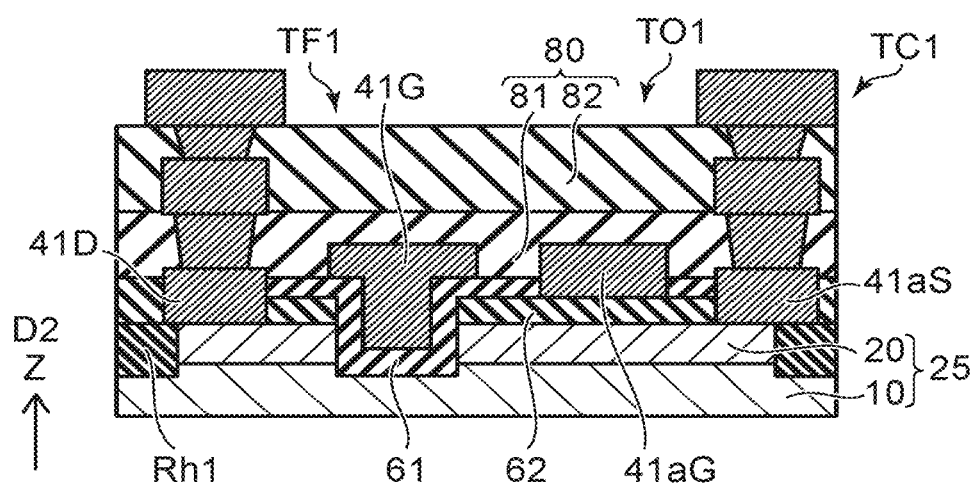
FIG. 15 is a schematic cross-sectional view illustrating a portion of the semiconductor device according to the fourth embodiment.

FIG. 15 is a schematic cross-sectional view illustrating a portion of the semiconductor device according to the fourth embodiment.

FIG. 15 illustrates the first control transistor part TC1 of the semiconductor device 140. As shown in FIG. 15, the direction from at least a portion of the first control drain electrode 41D toward the second semiconductor layer 20 is perpendicular to the second direction D2 (the Z-axis direction). A normally-off characteristic is obtained for the first control gate electrode 41G.

The second insulating film 62 is between the gate 41aG and the second semiconductor layer 20. A normally-on characteristic is obtained for the gate 41aG.

According to the embodiment, a semiconductor device can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor layers, electrodes, conductive members, base bodies, terminals, insulating members, insulating films, interconnects, circuits, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor member including a first semiconductor layer and a second semiconductor layer, the first semiconductor layer including $Al_{x1}Ga_{1-x1}N$ ($0 \leq x1 < 1$), the second semiconductor layer including $Al_{x2}Ga_{1-x2}N$ ($0 < x2 \leq 1$ and $x1 < x2$), the semiconductor member including a first region, a second region, and a first control region;
a first gate electrode extending along a first direction, a direction from the first region toward at least a portion of the first gate electrode being along a second direction crossing the first direction;
a second gate electrode extending along the first direction, a direction from the second region toward at least a portion of the second gate electrode being along the second direction, a third direction from the first gate electrode toward the second gate electrode crossing a plane including the first and second directions;

a first control transistor part including a first control gate electrode and a first control drain electrode, a direction from the first control region toward the first control gate electrode being along the second direction, the first control drain electrode being electrically connected to the first and second gate electrodes;

a gate interconnect electrically connected to the first and second gate electrodes; and a control gate interconnect electrically connected to the first control gate electrode; a third gate electrode extending along the first direction; a fourth gate electrode extending along the first direction; and a second control transistor part, the second gate electrode being between the first gate electrode and the fourth gate electrode in the third direction, the third gate electrode being between the second gate electrode and the fourth gate electrode in the third direction, the semiconductor member including a third region, a fourth region, and a second control region, a direction from the third region toward at least a portion of the third gate electrode being along the second direction, a direction from the fourth region toward at least a portion of the fourth gate electrode being along the second direction, the second control transistor part including a second control gate electrode and a second control drain electrode, a position in the third direction of the second control gate electrode being between a position in the third direction of the third gate electrode and a position in the third direction of the fourth gate electrode, a direction from the second control region toward the second control gate electrode being along the second direction, the second control drain electrode being electrically connected to the third and fourth gate electrodes, the third gate electrode and the fourth gate electrode being electrically connected to the gate interconnect, the second control gate electrode being electrically connected to the control gate interconnect.

2. The device according to claim 1, wherein
a position in the third direction of the first control gate electrode is between a position in the third direction of the first gate electrode and a position in the third direction of the second gate electrode.

3. The device according to claim 1, further comprising:
a third source electrode extending along the first direction;
a fourth source electrode extending along the first direction; and
a second drain electrode extending along the first direction,
the second drain electrode being between the third source electrode and the fourth source electrode in the third direction,
the third gate electrode being between the third source electrode and the second drain electrode in the third direction,
the fourth gate electrode being between the second drain electrode and the fourth source electrode in the third direction.

4. The device according to claim 3, wherein
a position in the first direction of the second control gate electrode is between a position in the first direction of the gate interconnect and a position in the first direction of the second drain electrode.

5. The device according to claim 1, wherein
a gate voltage of the gate interconnect is a first potential in a first period,
the gate voltage is a second potential in a second period,
the second potential is greater than the first potential,
a control gate voltage of the control gate interconnect is a third potential in the first period,
the control gate voltage is a fourth potential in the second period, and
the fourth potential is less than the third potential.

6. The device according to claim 1, further comprising:
a control circuit including an input part and an output part,
the input part being electrically connected to the gate interconnect,
the output part being electrically connected to the control gate interconnect,
the control circuit supplying, to the control gate interconnect, a control gate voltage corresponding to a gate voltage of the gate interconnect,
the gate voltage of the gate interconnect being a first potential in a first period,
the gate voltage being a second potential in a second period,
the second potential being greater than the first potential,
the control gate voltage of the control gate interconnect being a third potential in the first period,
the control gate voltage being a fourth potential in the second period,
the fourth potential being less than the third potential.

7. The device according to claim 1, further comprising:
a first control circuit transistor that is normally-on; and
a control circuit including an input part and an output part,
the input part being electrically connected to the gate interconnect,
the output part being electrically connected to the control gate interconnect,
the first control circuit transistor including a first control circuit gate and a first control circuit source,
the first control circuit gate and the first control circuit source being electrically connected to the gate interconnect.

8. The device according to claim 7, wherein
the control circuit includes a second control circuit transistor,
the second control circuit transistor is normally-off,
a second control circuit gate of the second control circuit transistor is electrically connected to the gate interconnect, and
a second control circuit drain of the second control circuit transistor is electrically connected to the control gate interconnect.

9. The device according to claim 1, further comprising:
a first source electrode extending along the first direction;
a second source electrode extending along the first direction; and
a first drain electrode extending along the first direction,
the first drain electrode being between the first source electrode and the second source electrode in the third direction,
the first gate electrode being between the first source electrode and the first drain electrode in the third direction,
the second gate electrode being between the first drain electrode and the second source electrode in the third direction.

10. The device according to claim 9, wherein
a position in the first direction of the first control gate electrode is between a position in the first direction of the gate interconnect and a position in the first direction of the first drain electrode.

11. The device according to claim 9, wherein
a gate-drain distance of the first control transistor part is less than a distance along the third direction between the first gate electrode and the first drain electrode.

12. The device according to claim 9, wherein
a distance along the first direction between the first control gate electrode and the gate interconnect is less than a distance along the third direction between the first gate electrode and the first drain electrode.

13. The device according to claim 9, wherein
the first control gate electrode includes a second overlap region overlapping the first control region in the second direction,
the first control transistor part further includes a first control source electrode electrically connected to the first and second source electrodes, and
a ratio of a length along the third direction of the second overlap region to a distance along the first direction between the first control source electrode and the first gate interconnect is 2 or more.

14. The device according to claim 13, wherein
the ratio is 10 or more.

15. The device according to claim 1, wherein
the first control transistor part includes a normally-off transistor and a normally-on transistor,
the normally-off transistor includes the first control gate electrode and the first control drain electrode,
a source of the normally-off transistor is electrically connected to a drain of the normally-on transistor, and
a gate of the normally-on transistor is electrically connected to a source of the normally-on transistor.

16. The device according to claim 1, wherein
the semiconductor member includes a first intermediate region provided between the first region and the first control region, and
an electrical resistance in the first intermediate region is greater than an electrical resistance in the first region and greater than an electrical resistance in the first control region.

17. The device according to claim 1, further comprising:
a gate terminal,
the first gate electrode and the second gate electrode being electrically connected to the gate terminal by the gate interconnect.

18. The device according to claim 17, wherein
a current path including the first gate electrode, the gate interconnect, and the gate terminal does not include a transistor, and
a current path including the second gate electrode, the gate interconnect, and the gate terminal does not include a transistor.

19. The device according to claim 1, further comprising:
a first insulating film, the first insulating film including a first insulating portion and a second insulating portion,
the first insulating portion being between the first semiconductor layer and the first gate electrode in the second direction,
a direction from at least a portion of the first insulating portion toward the second semiconductor layer being perpendicular to the second direction,
the second insulating portion being between the first semiconductor layer and the first control gate electrode in the second direction,
a direction from at least a portion of the second insulating portion toward the second semiconductor layer being perpendicular to the second direction.

* * * * *